(12) United States Patent
Chung et al.

(10) Patent No.: US 12,721,136 B2
(45) Date of Patent: Aug. 25, 2026

(54) SEMICONDUCTOR PACKAGE AND METHOD FOR MANUFACTURING THE SAME

(71) Applicant: Samsung Electronics Co., Ltd., Suwon-si (KR)

(72) Inventors: Hyunsoo Chung, Suwon-si (KR); Dae-Woo Kim, Suwon-si (KR); Young Lyong Kim, Suwon-si (KR); Inhyo Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 499 days.

(21) Appl. No.: 18/353,313

(22) Filed: Jul. 17, 2023

(65) Prior Publication Data

US 2024/0222230 A1 Jul. 4, 2024

(30) Foreign Application Priority Data

Dec. 29, 2022 (KR) ........................ 10-2022-0189163

(51) Int. Cl.
*H10W 70/05* (2026.01)
*H10W 20/00* (2026.01)
(Continued)

(52) U.S. Cl.
CPC ......... *H10W 20/20* (2026.01); *H10W 70/095* (2026.01); *H10W 70/611* (2026.01); *H10W 70/635* (2026.01); *H10W 74/47* (2026.01)

(58) Field of Classification Search
CPC ... H01L 23/481; H01L 21/486; H01L 23/293; H01L 23/5384; H01L 21/76898; H01L 23/535; H01L 24/82; H01L 2221/68345; H01L 2225/06513; H01L 2225/06527; H01L 2225/06541; H01L 2225/06562; H01L 23/5286; H01L 25/0652; H01L 21/6835; H01L 23/5389; H01L 2221/68359; H01L 2224/16148;
(Continued)

(56) References Cited

U.S. PATENT DOCUMENTS 10,490,520 B2 11/2019 Wang et al.
11,309,246 B2 4/2022 Dabral et al.
(Continued)

FOREIGN PATENT DOCUMENTS

KR 10-2022-0072838 A 6/2022

OTHER PUBLICATIONS

Office Action issued on May 8, 2026 in Korean Application No. 10-2022-0189163.

*Primary Examiner* — Herve-Louis Y Assouman
(74) *Attorney, Agent, or Firm* — Harness, Dickey & Pierce, P.L.C.

(57) ABSTRACT

A semiconductor package according to at least one embodiment may include: a first chiplet and a second chiplet disposed side by side with each other, wherein each of the first chiplet and the second comprises a substrate including an active side and a back side opposite to the active side; a back side power distribution network (BSPDN) in the back side of the substrate; and a third chiplet electrically coupling the first chiplet and the second chiplet to each other above the first chiplet and the second chiplet; and a fourth chiplet and a fifth chiplet disposed side by side with the third chiplet.

20 Claims, 17 Drawing Sheets

(51) Int. Cl.

| | |
|---|---|
| ***H10W 20/20*** | (2026.01) |
| ***H10W 20/40*** | (2026.01) |
| ***H10W 20/41*** | (2026.01) |
| ***H10W 70/60*** | (2026.01) |
| ***H10W 70/63*** | (2026.01) |
| ***H10W 72/00*** | (2026.01) |
| ***H10W 74/47*** | (2026.01) |
| ***H10W 90/00*** | (2026.01) |
| ***H10W 90/20*** | (2026.01) |
| ***H10W 90/24*** | (2026.01) |

(58) Field of Classification Search

CPC ....... H01L 2225/06586; H01L 23/3128; H01L 23/5283; H01L 23/5381; H01L 23/5386; H01L 25/0655; H01L 25/0657; H01L 25/50; H01L 2225/06517; H01L 2225/06589

See application file for complete search history.

(56) References Cited

U.S. PATENT DOCUMENTS

| | | | | |
|---|---|---|---|---|
| 2018/0145030 | A1* | 5/2018 | Beyne | H01L 21/76898 |
| 2020/0135645 | A1* | 4/2020 | Rubin | H01L 21/76802 |
| 2021/0193547 | A1* | 6/2021 | Wan | H01L 23/373 |
| 2021/0296246 | A1 | 9/2021 | Lane et al. | |
| 2021/0327836 | A1* | 10/2021 | Lin | H01L 23/5226 |
| 2021/0384133 | A1 | 12/2021 | Ong et al. | |
| 2021/0407942 | A1* | 12/2021 | Yu | H01L 24/06 |
| 2022/0077070 | A1 | 3/2022 | Chee et al. | |
| 2022/0149012 | A1 | 5/2022 | Or-Bach et al. | |
| 2022/0320042 | A1 | 10/2022 | Mantor | |

* cited by examiner

SEMICONDUCTOR PACKAGE AND METHOD FOR MANUFACTURING THE SAME

CROSS-REFERENCE TO RELATED APPLICATION

This application claims priority to and the benefit of Korean Patent Application No. 10-2022-0189163 filed in the Korean Intellectual Property Office on Dec. 29, 2022, the entire contents of which are incorporated herein by reference.

BACKGROUND

(a) Field of the Invention

The present disclosure relates to a semiconductor package and a method for manufacturing the same.

(b) Description of the Related Art

A semiconductor manufacturing technology to overcome a performance limitation of a conventional single chip is being developed.

If the plurality of chiplets are made smaller and an interconnect that transmits a signal and power is formed more concisely when the chiplets is packaged, more passive or active devices may be integrated within a given area. This leads to improved performance of a semiconductor package. Therefore, it is necessary to develop a new semiconductor package technology capable of miniaturizing the plurality of chiplets and simply forming the interconnect that transmits the signal and the power.

SUMMARY

In at least one embodiment, a back side power delivery network (BSPDN) structure may be formed at a back side of each of heterogeneous chiplets, and a chiplet for a silicon bridge overlapping a portion of a front side of the heterogeneous chiplets may be mounted at a front side of each of the heterogeneous chiplets so that the heterogeneous chiplets are electrically coupled. In at least one embodiment, in order to enhance a heat dissipation characteristic of a semiconductor package, chiplets formed in a dummy may be mounted at the front side of each of the heterogeneous chiplets. A semiconductor package according to at least one embodiment may include: a first chiplet and a second chiplet side by side with each other; a third chiplet above the first chiplet and the second chiplet and electrically coupling the first chiplet and the second chiplet to each other; and a fourth chiplet and a fifth chiplet side by side with the third chiplet. Each of the first chiplet and the second chiplet may include: a substrate including an active side and a back side opposite to the active side; and the back side of the substrate includes a back side power distribution network (BSPDN).

Each of the first chiplet and the second chiplet may further include a through silicon via (TSV) in the back side of the substrate.

The active side of each of the first chiplet and the second chiplet may further include: a back end of the line (BEOL) structure, and a front end of the line (FEOL) structure under the BEOL structure.

The FEOL structure may include a buried power rail (BPR).

One end of the through silicon via (TSV) may be bonded to the buried power rail (BPR), and the other end of the through silicon via (TSV) may be bonded to the back side power distribution network (BSPDN).

The FEOL structure may include a transistor.

One end of the TSV may be bonded to the transistor, and another end of the TSV may be bonded to the BSPDN.

The BEOL structure may include a plurality of signal wiring layers.

At least one of: the fourth chiplet and the fifth chiplet may be a dummy die.

The dummy die may include at least one of copper, aluminum, gold, silver, iron, or stainless steel.

The third chiplet may include a silicon (Si) bridge layer.

A semiconductor package according to another embodiment may include: a redistribution layer substrate; a first chiplet and a second chiplet above the redistribution layer substrate and side by side with each other, wherein each of the first chiplet and the second chiplet includes a back side power distribution network (BSPDN); a first redistribution layer structure on the first chiplet; a second redistribution layer structure on the second chiplet; a third chiplet above the first chiplet and the second chiplet, and overlapping with a partial region of the first redistribution layer structure and a partial region of the second redistribution layer structure, the third chiplet configured to electrically couple the first redistribution layer structure and the second redistribution layer structure; and a fourth chiplet and a fifth chiplet side by side with the third chiplet.

The semiconductor package may further include an encapsulant molding the first chiplet, the second chiplet, the third chiplet, the fourth chiplet, and the fifth chiplet on the redistribution layer substrate.

The encapsulant may further include an epoxy molding compound (EMC).

A method for manufacturing a semiconductor package according to at least one embodiment may include: forming a first chiplet and a second chiplet, wherein the first chiplet and the second chiplet include a back side power distribution network (BSPDN); forming a first redistribution layer structure on the first chiplet; forming a second redistribution layer structure on the second chiplet; mounting the first chiplet and the second chiplet on a third redistribution layer substrate; mounting a third chiplet above the first redistribution layer structure and the second redistribution layer structure such that the third chiplet overlaps on a partial region of the first redistribution layer structure and a partial region of the second redistribution layer structure and electrically couples the first redistribution layer structure and the second redistribution layer structure; mounting a fourth chiplet on the first redistribution layer structure and a fifth chiplet on the second redistribution layer structure such that the fourth chiplet and the fifth chiplet are side by side with the third chiplet; and molding the first redistribution layer structure, the second redistribution layer structure, the first chiplet, the second chiplet, the third chiplet, the fourth chiplet, and the fifth chiplet on the redistribution layer substrate.

The forming the first chiplet and the second chiplet may each include: forming a front end of the line (FEOL) structure on an active side of a first wafer; forming a first back end of the line (BEOL) structure on the FEOL structure; bonding a second wafer to the first BEOL structure; forming a through silicon via (TSV) at a back side of the first wafer and forming a second BEOL structure at the back side of the first wafer; and de-bonding the second wafer. The forming the first redistribution layer structure and the forming the second redistribution layer structure may include forming the first redistribution layer structure and the second redistribution layer structure on the first BEOL structure of first chiplet and the second chiplet, respectively.

The bonding the second wafer to the first BEOL structure may include bonding an oxide layer of the second wafer to the first BEOL structure.

The forming the FEOL structure on the active side of the first wafer may include forming a transistor and a buried power rail (BPR).

The forming the first BEOL structure on the FEOL structure may include forming a plurality of signal wiring layers.

The forming the through silicon via (TSV) at the back side of the first wafer and forming the second BEOL structure at the back side of the first wafer may include forming a back side power distribution network (BSPDN).

According to at least one embodiment, when the embodiment is compared with a back end of the line (BEOL) structure that serves to transmit a signal and power at a front side of a substrate of conventional chiplets, if chiplets including a BEOL structure for a signal at a front side of a substrate and a BEOL structure of a back side power delivery network (BSPDN) structure at a back side of the substrate are used, an area and resistance of the BEOL structure at the front side of the substrate may be reduced so that signal and power characteristics of a semiconductor package are improved.

According to at least one embodiment, the heat dissipation characteristic of the semiconductor package may be enhanced by mounting the chiplets formed in the dummy at the front surface of each of the heterogeneous chiplets.

According to at least one embodiment, the chiplet for the silicon bridge overlapping the portion of the front side of the heterogeneous chiplets may be mounted at the front side of each of the heterogeneous chiplets so that a signal characteristic of the heterogeneous chiplets within the semiconductor package is improved and the semiconductor package in which various elements are mounted at high density is provided.

BRIEF DESCRIPTION OF THE DRAWINGS

FIG. 14 is a cross-sectional view illustrating a step of mounting a fourth chiplet and a fifth chiplet on the first chiplet and the second chiplet as one of the steps of the method for manufacturing the semiconductor package according to the at least one embodiment.

FIG. 15 is a cross-sectional view illustrating a step of molding the first chiplet, the second chiplet, the third chiplet, the fourth chiplet, and the fifth chiplet on the redistribution layer substrate as one of the steps of the method for manufacturing the semiconductor package according to the at least one embodiment.

DETAILED DESCRIPTION

Figure 1:
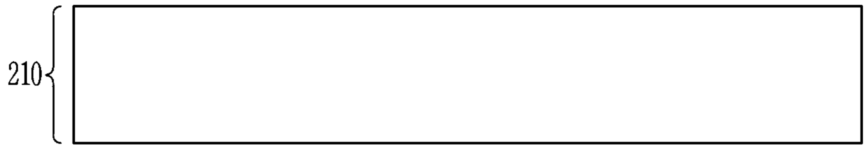
FIG. 1 is a cross-sectional view showing a step of providing a first substrate as one of a plurality of steps of a method for manufacturing a chiplet according to at least one embodiment.

The present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure.

In order to clearly describe the present disclosure, parts or portions that are irrelevant to the description are omitted, and identical or similar constituent elements throughout the specification are denoted by the same reference numerals.

Further, in the drawings, the size and thickness of each element are illustrated for ease of description, and the present disclosure is not necessarily limited to those illustrated in the drawings. For example, the size of each component in the drawings may be exaggerated for clarity and convenience of description.

Throughout the specification, when a part is "connected" to another part, it includes not only a case where the part is "directly connected" but also a case where the part is "indirectly connected" with another part in between. In addition, unless explicitly described to the contrary, the word "comprise" and variations such as "comprises" or "comprising" will be understood to imply the inclusion of stated elements but not the exclusion of any other elements.

It will be understood that when an element such as a layer, film, region, area, or substrate is referred to as being "on" or "above" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction. Therefore, it will also be understood that spatially relative terms, such as "above", "top", etc., are intended to encompass different orientations of the device in use or operation in addition to the orientation depicted in the figures, and that the device may be otherwise oriented (rotated 90 degrees or at other orientations) and the spatially relative terms used herein interpreted accordingly.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Hereinafter, a semiconductor package and a method for manufacturing the semiconductor package according to at least one embodiment will be described with reference to the drawings.

FIG. 1 is a cross-sectional view illustrating a step of providing a first substrate 210 as one of a plurality of steps of a method for manufacturing a chiplet according to at least one embodiment.

Referring to FIG. 1, the first substrate 210 is provided. In at least one embodiment, the first substrate 210 may be a semiconductor substrate doped with a p-type or n-type dopant. In another embodiment, the first substrate 210 may be undoped. In at least one embodiment, the first substrate 210 may comprise an elemental and/or a compound semiconductor. For example, in at least one embodiment, the first substrate 210 is bulk silicon, a silicon-on-insulator (SOI), a silicon substrate, a silicon germanium substrate, a silicon germanium-on-insulator (SGOI) substrate, a silicon carbide substrate, a indium antimonide substrate, a lead tellurium compound substrate, an indium arsenide substrate, an indium phosphide substrate, a gallium arsenide substrate, and/or a gallium antimonide substrate, but the present disclosure is not limited thereto.

Figure 2:
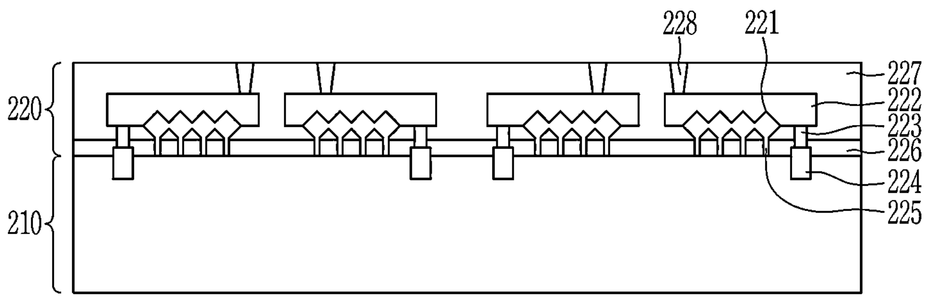
FIG. 2 is a cross-sectional view illustrating a step of forming a front end of the line (FEOL) structure on the first substrate as one of the steps of the method for manufacturing the chiplet according to the embodiment.

FIG. 2 is a cross-sectional view illustrating a step of forming a front end of the line (FEOL) structure 220 on the first substrate 210 as one of the steps of the method for manufacturing the chiplet according to the at least one embodiment.

Referring to FIG. 2, the FEOL structure 220 of a chiplet may include epitaxial layers 221, an epitaxial contact 222, a buried power rail (BPR) 224, fins 225, a shallow trench isolation (STI) 226, and an insulating layer 227.

Describing a formation process of the FEOL structure, first, the first substrate 210 is patterned to form the fins 225. The fins 225 may be channel structures of each of fin field effect transistors (FinFETs).

Next, the shallow trench isolation (STI) 226 is formed. In at least one embodiment, the shallow trench isolation region (STI) 226 may include an insulator, such as a silicon oxide, a silicon oxynitride, a silicon nitride, a combination, and/or the like, and may be formed by low pressure chemical vapor deposition (LPCVD), plasma enhanced CVD (PECVD), flowable CVD, and/or the like. In at least one embodiment, the STI 226 may include spin-on-glass (SOG), SiO, SiON, SiOCN, fluoride-doped silicate glass (FSG), a combination thereof, and/or the like.

Next, a trench is formed at a level below the fins 225, and the trench is filled with a conductive material, and then the conductive material is etched to form the buried power rail (BPR) 224. The buried power rail (BPR) 224 serves to deliver electric power to the epitaxial layers 221 that are active regions. The buried power rail (BPR) 224 may include, for example at least one of: cobalt (Co), tungsten (W), ruthenium (Ru), an alloy thereof, and/or the like.

Next, the epitaxial layers 221 are formed on the fins 225. The epitaxial layers 221 may include active regions of transistors (e.g., source regions and/or drain regions).

Next, the insulating layer 227 burying the epitaxial layers 221 is formed. In at least one embodiment, the insulating layer 227 may include a silicon oxide, a silicon nitride, a silicon oxynitride, a tetraethyl orthosilicate (TEOS) forming oxide, phosphosilicate glass (PSG), borophosphosilicate glass (BPSG), a low-k dielectric material, another suitable dielectric material, a combination thereof, and/or the like. In at least one embodiment, the insulating layer 227 may be formed by a CVD, physical vapor deposition (PVD), atomic layer deposition (ALD), high-density plasma CVD (HDPCVD), metal organic CVD (MOCVD), remote plasma CVD (RPCVD), PECVD, LPCVD, atmospheric pressure CVD (APCVD), (and/or the like) process.

Next, the epitaxial contact 222 (bonded to the epitaxial layers 221 and extending in a horizontal direction), first vias 223 (bonded to the epitaxial contact 222 and the buried power rail (BPR) 224), and second vias 228 (to bond the epitaxial contact 222 and a first metal pad 232 of a first back end of the line (BEOL) structure 230) are formed. For example, at least one of the epitaxial contact 222, the first vias 223, and/or the second vias 228 may be formed by etching the insulating layer 227 to form a trench and filling the trench with a conductive material, such as a metal. For example, the epitaxial contact 222, the first vias 223, and the second vias 228 may include at least one of: copper, aluminum, tungsten, nickel, gold, tin, titanium, an alloy thereof, and/or the like. In at least one embodiment, the epitaxial contact 222, the first vias 223, and the second vias 228 may be formed by performing a PVD process.

Figure 3:
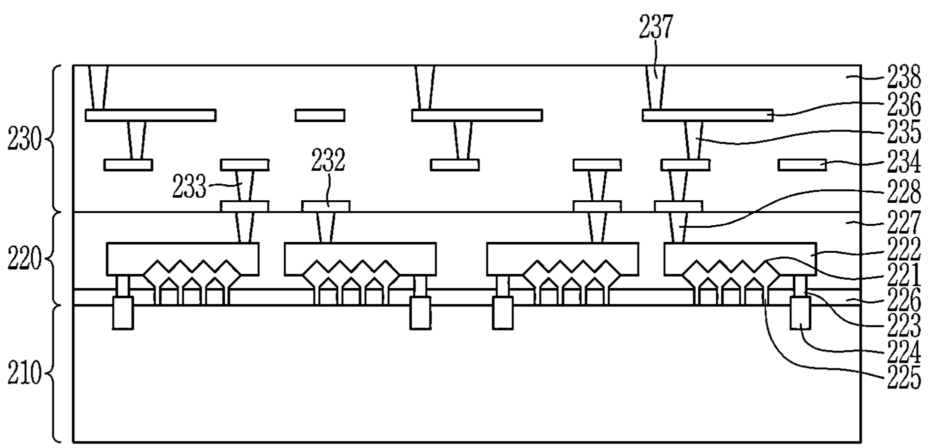
FIG. 3 is a cross-sectional view illustrating a step of forming a first back end of the line (BEOL) structure on the FEOL structure as one of the steps of the method for manufacturing the chiplet according to the at least one embodiment.

FIG. 3 is a cross-sectional view illustrating a step of forming the first BEOL structure 230 on the FEOL structure 220 as one of the steps of the method for manufacturing the chiplet according to the at least one embodiment.

Referring to FIG. 3, the first BEOL structure 230 is formed on the FEOL structure 220. The first BEOL structure 230 may include a first metal wiring structure connecting each element and a first intermetal dielectric (IMD) 238.

The first metal wiring structure may be a structure including at least one wiring layer that is configured to transmit a signal between elements. The first metal wiring structure may include the first metal pad 232, first contact plugs 233, 235, and 237, and first metal wiring layers 234 and 236. The first metal pad 232 and the first metal wiring layers 234 and 236 are patterned in a horizontal direction to transmit a signal at the same level layer. The first contact plugs 233, 235, and 237 are patterned in a vertical direction to interconnect the first metal pad 232 and the first metal wiring layers 234 and 236 so that a signal between different level layers is transferred. In at least one embodiment, the first metal pad 232, the first contact plugs 233, 235, and 237, and the first metal wiring layers 234 and 236 may include a conductive material, such as at least one of: copper, aluminum, tungsten, nickel, gold, tin, titanium, an alloy thereof, and/or the like. Though an example has been illustrated, the examples are not limited to the illustrated example; for example, the first metal wiring structure may include fewer or more first metal pads 232, fewer or more first contact plugs 233, 235, and 237, and/or fewer or more first metal wiring layers 234 and 236 and still be included within the scope of the present disclosure.

The first intermetal dielectric (IMD) 238 buries and insulates the first metal pad 232, the first contact plugs 233, 235, and 237, and the first metal wiring layers 234 and 236. In at least one embodiment, the first intermetal dielectric 238 may include an insulator, such as a silicon oxide, a silicon nitride, a silicon oxynitride, a TEOS forming oxide, PSG, BPSG, a low-k dielectric material, another suitable dielectric material, a combination thereof, and/or the like.

In at least one embodiment, a process of the first BEOL structure includes, first, forming the first intermetal dielectric (IMD) 238. In at least one embodiment, the first intermetal dielectric (IMD) 238 may be formed by a CVD, PVD, ALD, HDPCVD, MOCVD, RPCVD, PECVD, LPCVD, or APCVD process.

Next, the first metal pad 232 may be formed by etching the first intermetal dielectric 238 to form a trench and filling the trench with a metal. In at least one embodiment, the first metal pad 232 may be formed by performing a PVD process.

Next, a chemical mechanical polishing (CMP) process is performed at an upper surface of the first metal pad 232 and an upper surface of the first intermetal dielectric 238 so that the upper surfaces of the first metal pad 232 and the first intermetal dielectric 238 are planarized.

Thereafter, the first contact plug 233 and the first intermetal dielectric (IMD) 238, the first metal wiring layer 234 and the first intermetal dielectric (IMD) 238, the first contact plug 235 and the first intermetal dielectric (IMD) 238, the first metal wiring layer 236 and the first intermetal dielectric (IMD) 238, and the first contact plug 237 and the first intermetal dielectric (IMD) 238 may be formed by applying the same characteristic as a characteristic of a formation process of the first metal pad 232 and the first intermetal dielectric 238 described above.

Figure 4:
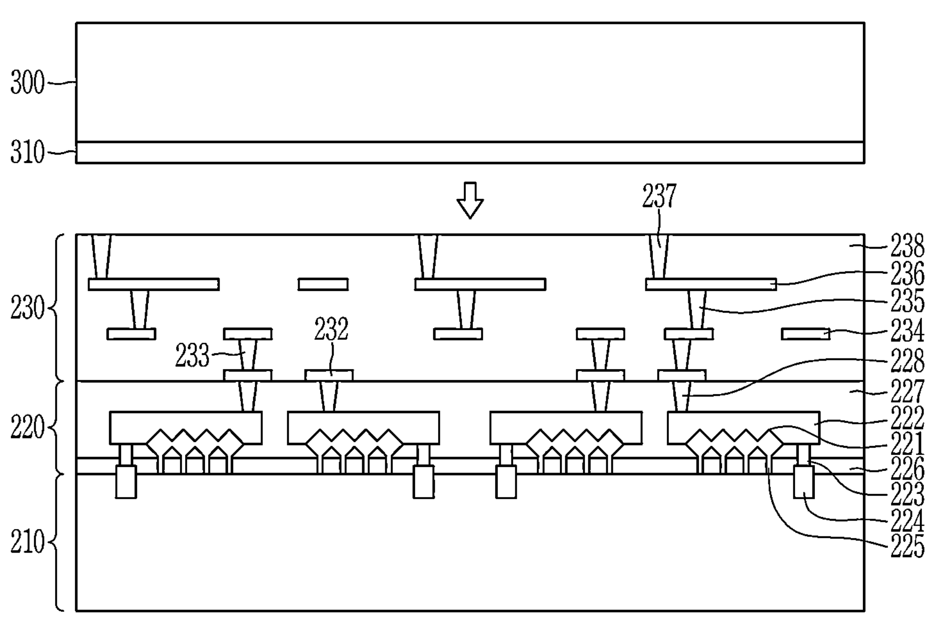
FIG. 4 is a cross-sectional view illustrating a step of bonding a second substrate to the first BEOL structure as one of the steps of the method for manufacturing the chiplet according to the at least one embodiment.

FIG. 4 is a cross-sectional view illustrating a step of bonding a second substrate 300 to the first BEOL structure 230 as one of the steps of the method for manufacturing the chiplet according to the embodiment.

Referring to FIG. 4, the second substrate 300 is bonded to the first BEOL structure 230. The second substrate 300 includes an oxide layer 310 for bonding. In at least one embodiment, the second substrate 300 may comprise an elemental and/or a compound semiconductor, and may include, for example, a silicon wafer.

Figure 5:
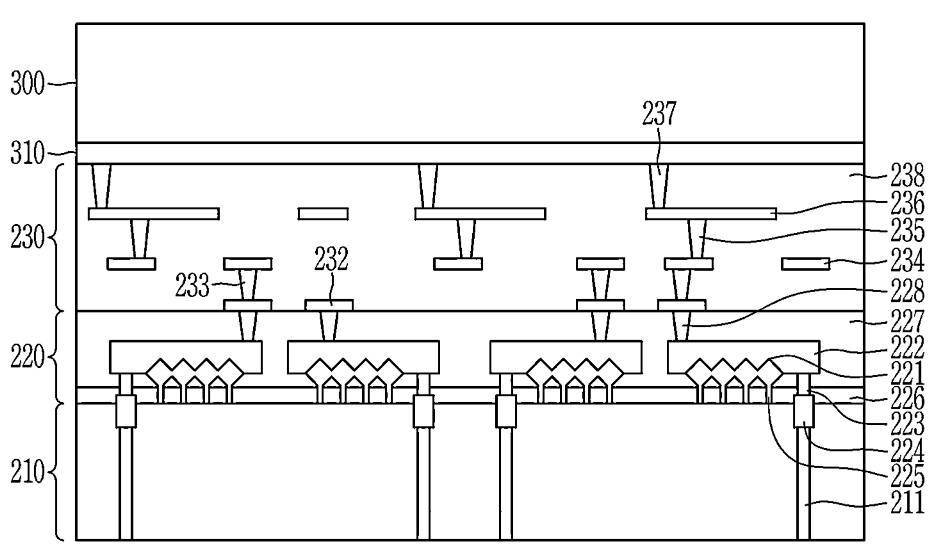
FIG. 5 is a cross-sectional view illustrating a step of forming a through silicon via (TSV) at a back side (a rear surface) of the first substrate as one of the steps of the method for manufacturing the chiplet according to the at least one embodiment.

FIG. 5 is a cross-sectional view illustrating a step of forming a through silicon via (TSV) 211 on a back side of the first substrate 210 as one of the steps of the method for manufacturing the chiplet according to the at least one embodiment.

Referring to FIG. 5, the through silicon via (TSV) 211 electrically couples the buried power rail (BPR) 224 of the first FEOL structure 220 and a second metal pad 247 of a second BEOL structure 240. The through silicon via (TSV) 211 is formed by forming holes penetrating an insulating material from the back side of the first substrate 210 and filling the holes with a conductive material. In at least one embodiment, the hole of the through silicon via (TSV) 211 may be formed by deep etching and/or by a laser. In at least one embodiment, the hole of the through silicon via (TSV) 211 may be filled with a conductive material by electroplating. In at least one embodiment, the through silicon via (TSV) 211 may include at least one of: tungsten (W), aluminum (Al), copper (Cu), an alloy thereof, and/or the like.

A barrier layer (not shown) may be formed between the through silicon via (TSV) 211 and an insulating material of the first substrate 210. In at least one embodiment, the barrier layer (not shown) may include at least one of: titanium (Ti), tantalum (Ta), titanium nitride (TiN), tantalum nitride (TaN), an alloy thereof, and/or the like.

Figure 6:
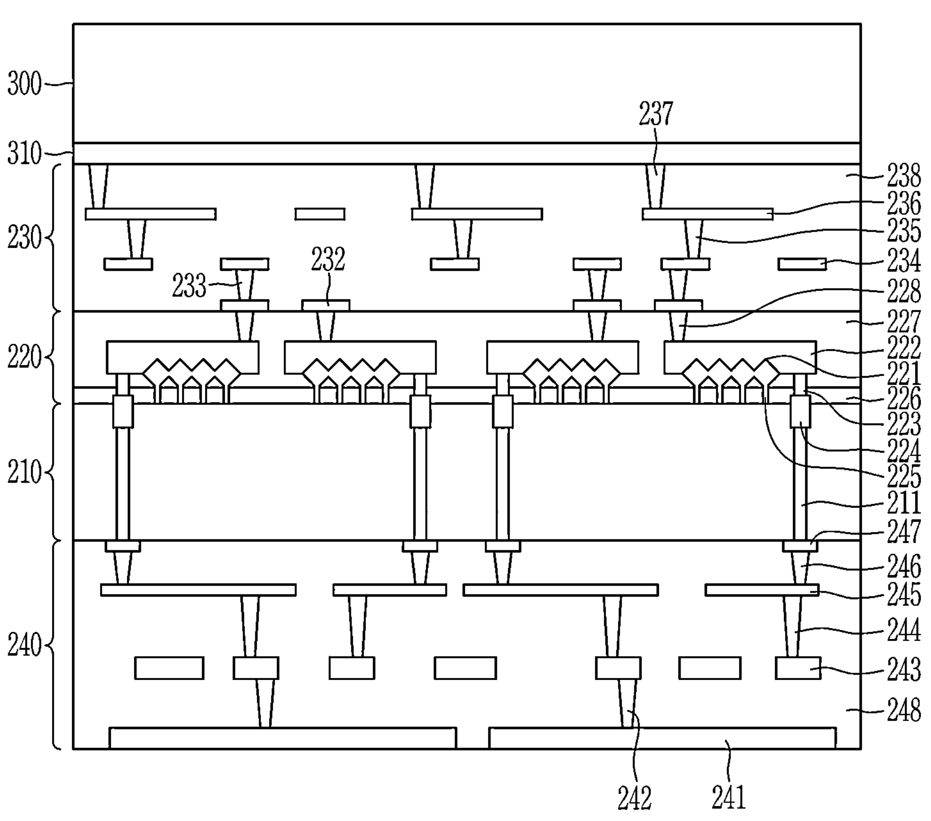
FIG. 6 is a cross-sectional view illustrating a step of forming a second BEOL structure at the back side of the first substrate as one of the steps of the method for manufacturing the chiplet according to the at least one embodiment.

FIG. 6 is a cross-sectional view illustrating a step of forming the second BEOL structure 240 at the back side of the first substrate 210 as one of the steps of the method for manufacturing the chiplet according to the at least one embodiment.

Referring to FIG. 6, the second BEOL structure 240 is formed at the back side of the first substrate 210. The second BEOL structure 240 is a back side power distribution network (BSPDN). In these cases, the second BEOL structure 240 is configured to deliver electric power to each element. For example, the second BEOL structure 240 may include a second metal wiring structure connecting each element and a second inter metal dielectric (IMD) 248.

The second metal wiring structure may include the second metal pad 247, second contact plugs 242, 244, and 246, and second metal wiring layers 241, 243, and 245. The second metal pad 247 and the second metal wiring layers 241, 243, and 245 are patterned in a horizontal direction to transmit electric power at the same level layer. The second contact plugs 242, 244, and 246 are patterned in a vertical direction to interconnect the second metal pad 247 and the second metal wiring layers 241, 243, and 245 so that electric power between different level layers is transferred. In at least one embodiment, the second metal pad 247, the second contact plugs 242, 244, and 246, and the second metal wiring layers 241, 243, and 245 may include a conductive material, such as at least one of: copper, aluminum, tungsten, nickel, gold, tin, titanium, an alloy thereof, and/or the like. Though an example has been illustrated, the examples are not limited to the illustrated example; for example, the second metal wiring structure may include fewer or more second metal pads 247, fewer or more second contact plugs 242, 244, and 246, and/or fewer or more second metal wiring layers 241, 243, and 245 and still be included within the scope of the present disclosure.

The second inter metal dielectric (IMD) 248 buries and insulates the second metal pad 247, the second contact plugs 242, 244, and 246, and the second metal wiring layers 241, 243, and 245. In at least one embodiment, the second inter metal dielectric (IMD) 248 may include an insulator, such as a silicon oxide, a silicon nitride, a silicon oxynitride, a TEOS forming oxide, PSG, BPSG, a low-k dielectric material, another suitable dielectric material, a combination thereof, and/or the like.

A formation process of the second BEOL structure 240 may be formed by applying the same characteristic as characteristic of a formation process of the first BEOL structure 230 described above.

Figure 7:
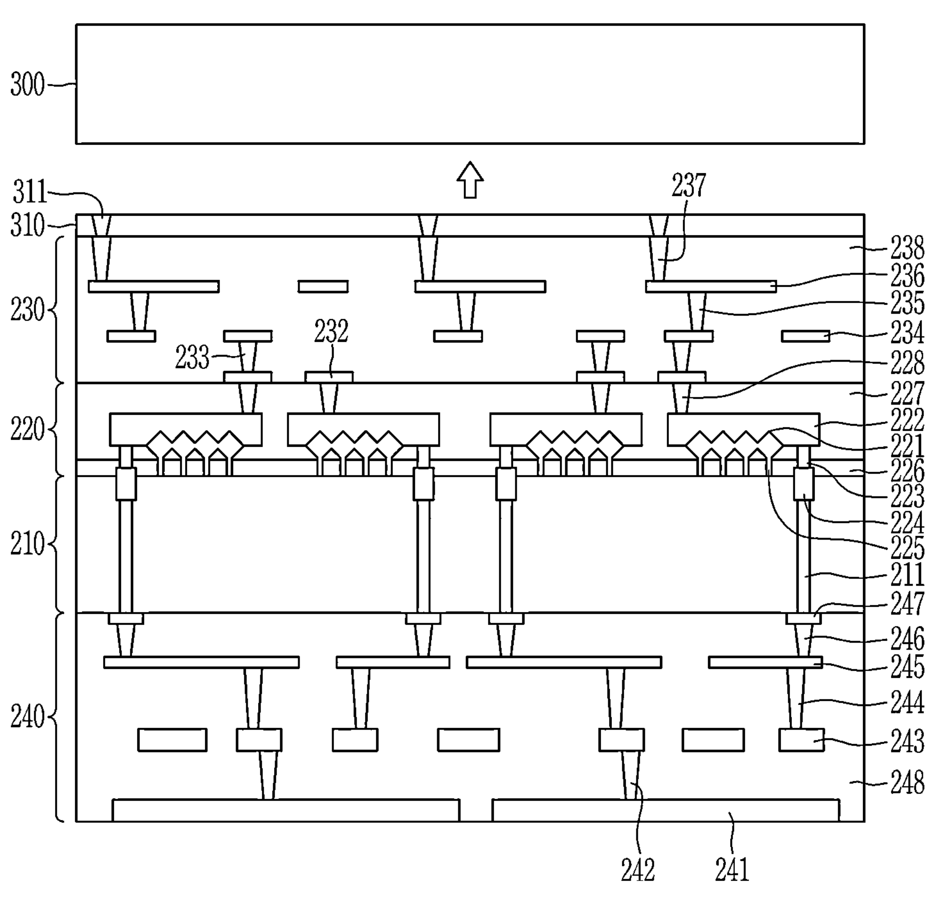
FIG. 7 is a cross-sectional view illustrating a step of de-bonding the second substrate as one of the steps of the method for manufacturing the chiplet according to the at least one embodiment.

FIG. 7 is a cross-sectional view illustrating a step of de-bonding the second substrate 300 as one of the steps of the method for manufacturing the chiplet according to the embodiment.

Referring to FIG. 7, the second substrate 300 is de-bonded except for the oxide layer 310. After de-bonding the second substrate 300, a third via 311 is formed at the oxide layer 310. The third via 311 is formed by forming a hole at the oxide layer 310 and filling the hole with a conductive material. In at least one embodiment, the third via 311 may include at least one of: copper, aluminum, tungsten, nickel, gold, tin, titanium, an alloy thereof, and/or the like.

Figure 8:
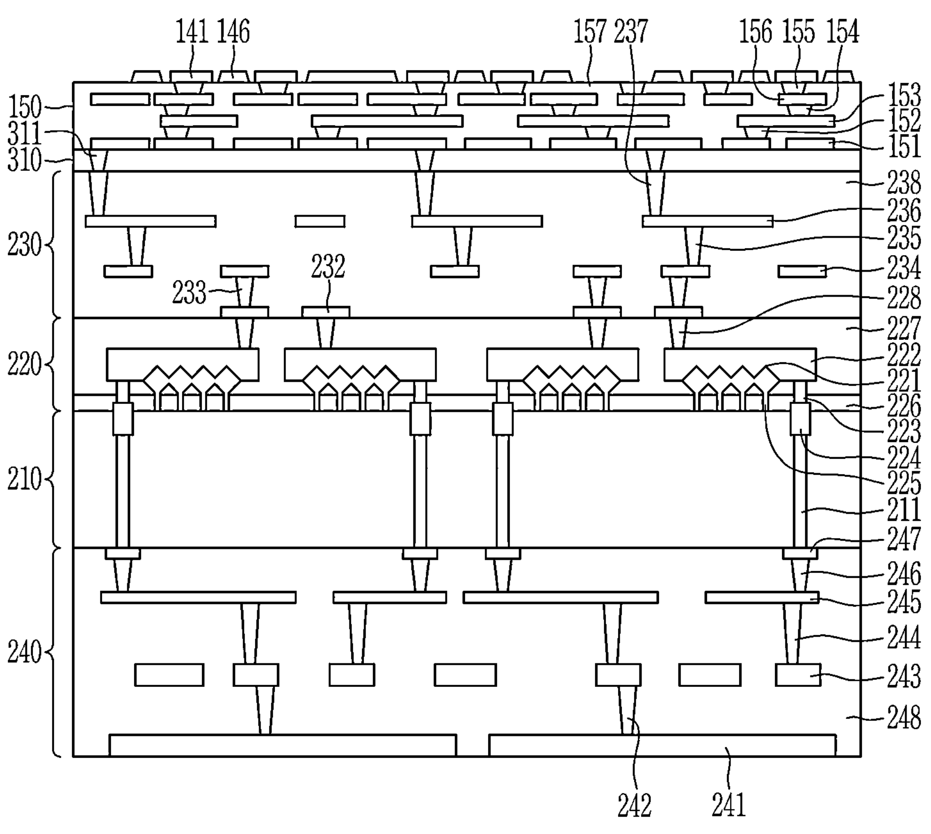
FIG. 8 is a cross-sectional view illustrating a step of forming a redistribution layer structure on the first BEOL structure as one of the steps of the method for manufacturing the chiplet according to the at least one embodiment.

FIG. 8 is a cross-sectional view illustrating a step of forming a redistribution layer structure 150 on the first BEOL structure 230 as one of the steps of the method for manufacturing the chiplet according to the at least one embodiment.

Referring to FIG. 8, the redistribution layer structure 150 is formed on the first BEOL structure 230. The redistribution layer structure 150 may include a dielectric layer 157, and redistribution lines 151, 153, and 156 and redistribution vias 152, 154, and 155 within the dielectric layer 157. Though an example has been illustrated, the examples are not limited to the illustrated example; for example, a redistribution layer substrate may include a fewer or more redistribution lines and/or a fewer or more redistribution vias and still be included within the scope of the present disclosure.

In a process of forming the redistribution layer structure 150, the dielectric layer 157 is formed on the first BEOL structure 230. In at least one embodiment, the dielectric layer 157 is formed of a polymer (such as polybenzoxazoles (PBO), polyimide, and/or the like) and/or an inorganic dielectric material (such as a silicon nitride, a silicon oxide, and/or the like). In at least one embodiment, the dielectric layer 157 may be formed by a CVD, ALD, or PECVD process.

After forming the dielectric layer 157, a via hole is formed by selectively etching the dielectric layer 157, and redistribution lines 151 are formed by filling the via hole with a conductive material. In at least one embodiment, the redistribution lines 151 may include a conductive material such as at least one of: copper, aluminum, tungsten, nickel, gold, tin, titanium, an alloy thereof, and/or the like. In at least one embodiment, the redistribution lines 151 may be formed by performing a sputtering process and/or by an electroplating process after forming a seed metal layer.

Next, the dielectric layer 157 is additionally deposited on the redistribution lines 151 and the dielectric layer 157, and the additionally deposited dielectric layer 157 is selectively etched to form redistribution vias 152. Thereafter, the redistribution lines 153 and the dielectric layer 157, the redistribution vias 154 and the dielectric layer 157, the redistribution lines 156 and the dielectric layer 157, and the redistribution vias 155 and the dielectric layer 157 may be repeatedly formed in the same way as forming the redistribution lines 151 and the dielectric layer 157, and the redistribution vias 152 and the additional dielectric layer 157.

Next, an insulating layer 146 and a bonding pad 141 may be formed on the dielectric layer 157 of the redistribution layer structure 150. In at least one embodiment, the insulating layer 146 may be a solder resist. The insulating layer 146 may include a plurality of openings for soldering. In at least one embodiment, the bonding pad 141 may include a conductive material, such as at least one of: copper, nickel, zinc, gold, silver, platinum, palladium, chromium, titanium, an alloy thereof, and/or the like.

Figure 9:
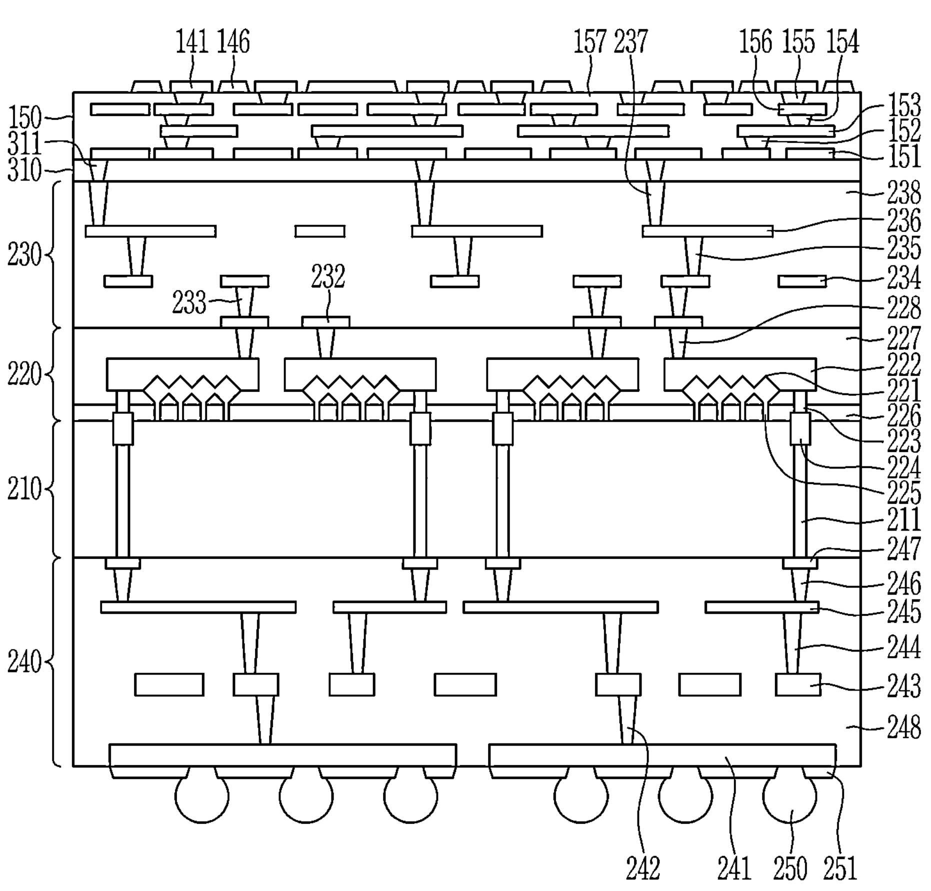
FIG. 9 is a cross-sectional view illustrating a step of forming an external connection terminal below the second BEOL structure as one of the steps of the method for manufacturing the chiplet according to the at least one embodiment.

FIG. 9 is a cross-sectional view illustrating a step of forming a connection member 250 below the second BEOL structure 240 as one of the steps of the method for manufacturing the chiplet according to the at least one embodiment.

Referring to FIG. 9, an insulating layer 251 and the connection member 250 are formed below the second BEOL structure 240. In at least one embodiment, the insulating layer 251 may be a solder resist. The insulating layer 251 may include a plurality of openings for soldering. In at least one embodiment, the connection member 250 may include a conductive material such as a solder. The solder may include, for example, at least one of: tin, silver, lead, nickel, copper, a eutectic alloy thereof, and/or the like.

Figure 10:
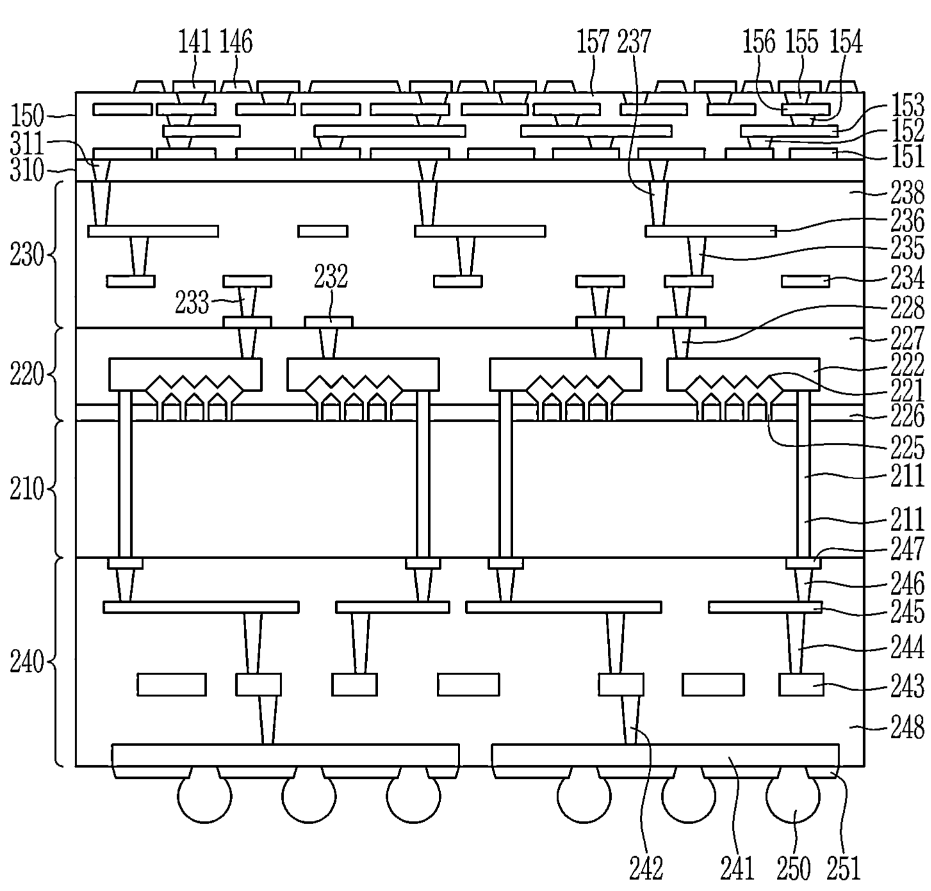
FIG. 10 is a cross-sectional view illustrating a chiplet of at least one embodiment different from that of FIG. 9, in which a through silicon via (TSV) is directly bonded to an epitaxial contact.

FIG. 10 is a cross-sectional view illustrating a chiplet of at least one embodiment different from that of FIG. 9, in which the through silicon via (TSV) 211 is directly bonded to the epitaxial contact 222.

Referring to FIG. 10, one end of the through silicon via (TSV) 211 is bonded to the second metal pad 247 of the second BEOL structure 240, and the other end of the through silicon via (TSV) 211 is directly bonded to the epitaxial contact 222. When FIG. 10 is compared with FIG. 9 in which one end of the through silicon via (TSV) 211 is bonded to the second metal pad 247 of the second BEOL structure 240 and the other end of the through silicon via (TSV) 211 is directly bonded to the buried power rail (BPR) 224, the through silicon via (TSV) 211 in the embodiment of FIG. 10 may be directly bonded to the epitaxial contact 222 without forming the buried power rail (BPR) 224 to transfer electric power.

For reference, in FIGS. 1 to 10, a feature of the chiplet is described based on the chiplet including the FinFET transistor according to the embodiment, but in another embodiment, the structure of FIGS. 1 to 10 may be applied to a chiplet including a gate-all-around transistor.

Figure 11:
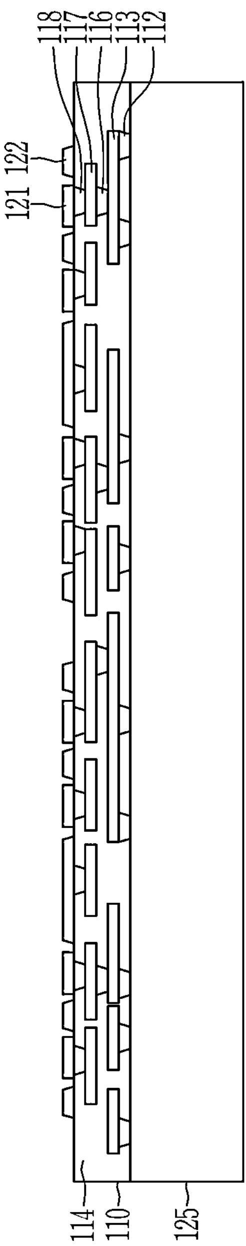
FIG. 11 is a cross-sectional view illustrating a step of forming a redistribution layer substrate on a carrier as one of a plurality of steps of a method for manufacturing a semiconductor package according to at least one embodiment.

FIG. 11 is a cross-sectional view illustrating a step of forming a redistribution layer substrate 110 on a carrier 125 as one of a plurality of steps of a method for manufacturing a semiconductor package 100 according to at least one embodiment.

Referring to FIG. 11, a front redistribution layer substrate 110 is formed on the carrier 125.

For example, the carrier 125 may include a silicon-based material (such as glass or a silicon oxide), an organic material, an aluminum-based material (such as aluminum oxide), a combination thereof, and/or the like.

The front redistribution layer substrate 110 may include a dielectric layer 114, and redistribution lines 113 and 117 and redistribution vias 112, 116, and 118 within the dielectric layer 114. Though an example has been illustrated, the examples are not limited to the illustrated example; for example, a redistribution layer substrate may include fewer or more redistribution lines and/or fewer or more redistribution vias and still be included within the scope of the present disclosure.

A formation process of the front redistribution layer substrate 110 may be formed by applying the same characteristic as a characteristic of a formation process of the redistribution layer structure 150 described above.

Figure 12:
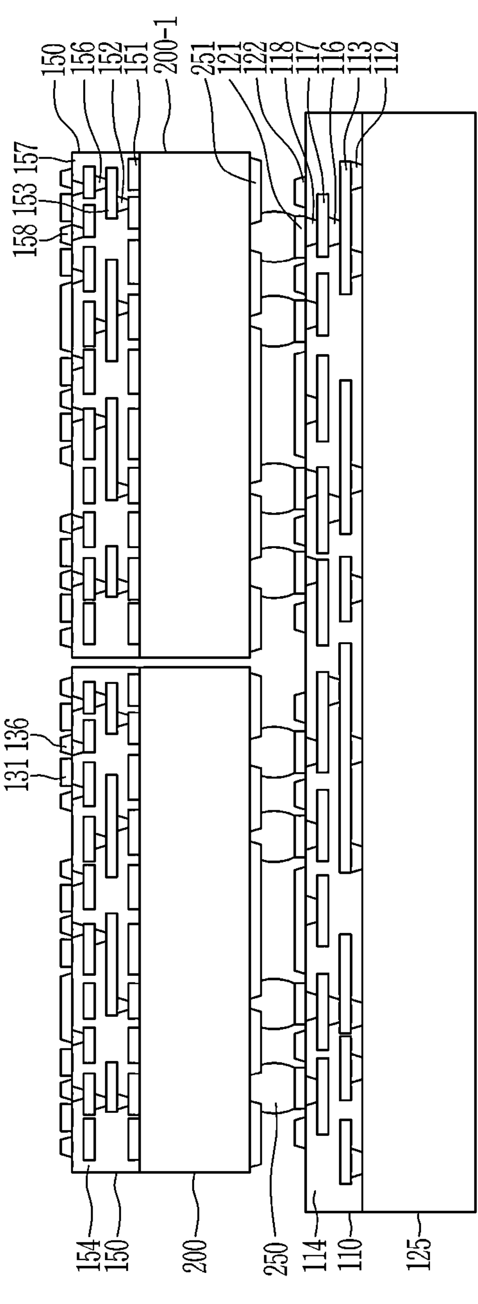
FIG. 12 is a cross-sectional view illustrating a step of mounting a first chiplet and a second chiplet on the redistribution layer substrate as one of the steps of the method for manufacturing the semiconductor package according to the at least one embodiment.

FIG. 12 is a cross-sectional view illustrating a step of mounting a first chiplet 200 and a second chiplet 200-1 on the redistribution layer substrate 110 as one of the steps of the method for manufacturing the semiconductor package 100 according to the embodiment.

Referring to FIG. 12, the first chiplet 200 and the second chiplet 200-1 are mounted on the redistribution layer substrate 110. The first chiplet 200 and the second chiplet 200-1 may be disposed side by side. The first chiplet 200 and the redistribution layer structure 150 may be formed, e.g., by the method referenced in FIGS. 1 to 10; and the second chiplet 200-1 may be the same type or different type of chiplet as the first chiplet 200. Therefore, the structure of the first chiplet of FIGS. 1 to 10 may be equally applied to a structure of the first chiplet 200 and the second chiplet 200-1.

Each of the first chiplet 200 and the second chiplet 200-1 may be bonded to a bonding pad 121 disposed at an upper surface of the redistribution layer substrate 110 by a connection member 250 formed at lower surfaces of the first chiplet 200 and the second chiplet 200-1.

Each of the first chiplet 200 and the second chiplet 200-1 includes a substrate including an active side and a back side opposite to the active side. Each of the first chiplet 200 and the second chiplet 200-1 includes the FEOL structure on the active side of the first substrate 210 and the first BEOL structure on the FEOL structure, and includes the second BEOL structure below the back side of the first substrate 210. The second BEOL structure includes a back side power distribution network (BSPDN). For example, the first chiplet 200 and the second chiplet 200-1 may be bonded to the redistribution layer substrate 110 through the back side.

In the first chiplet 200 and the second chiplet 200-1, the first BEOL structure at a front side of the first substrate 210 transmits a signal between elements, and the second BEOL structure at a back side of the first substrate 210 is electrically coupled to a reference voltage (VSS) and a supply voltage (VDD) to deliver electric power. As a result, an interconnection density of the first BEOL structure 230 may be increased by disposing a power rail above or on the back side of the first substrate 210 instead of the front side of the first substrate 210. In addition, the second BEOL structure 240 may accommodate a wider power rail, may reduce resistance, and may increase efficiency of power delivery to a transistor.

Figure 13:
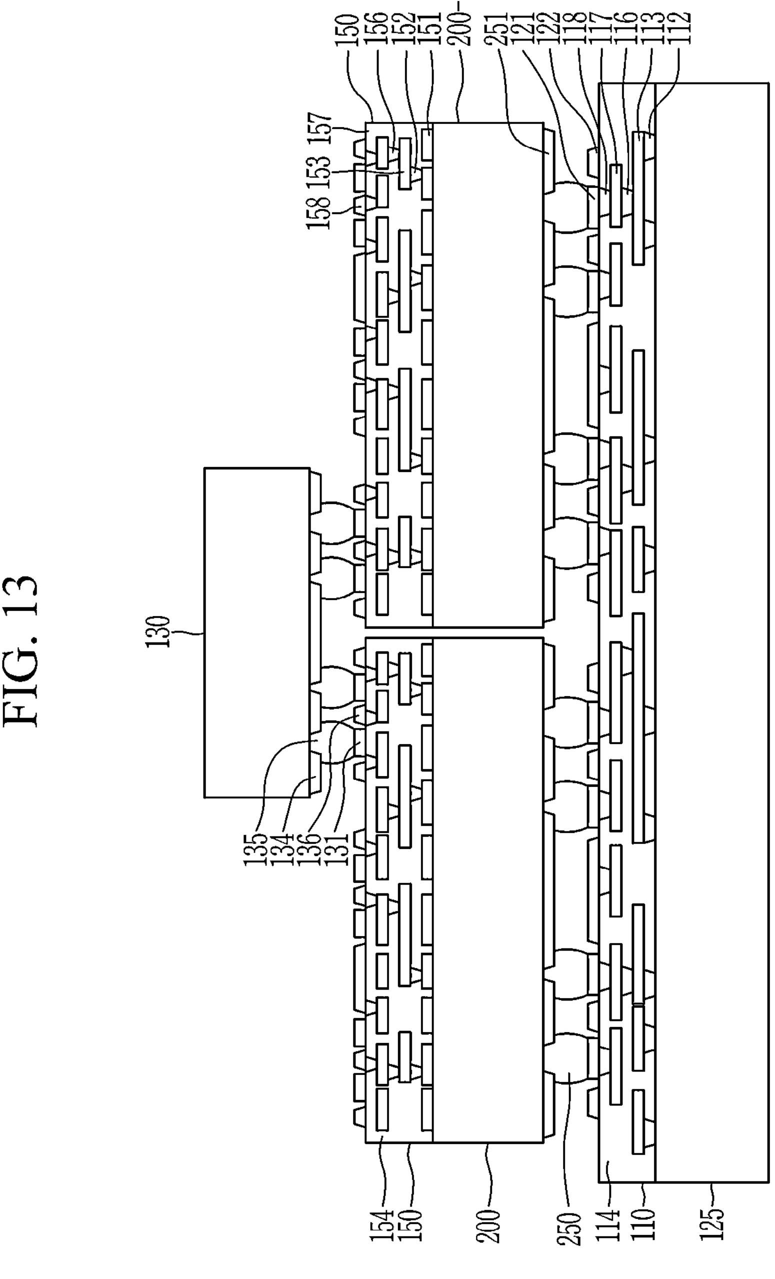
FIG. 13 is a cross-sectional view illustrating a step of connecting the first chiplet and the second chiplet with a third chiplet as one of the steps of the method for manufacturing the semiconductor package according to the at least one embodiment.

FIG. 13 is a cross-sectional view illustrating a step of connecting the first chiplet 200 and the second chiplet 200-1 with a third chiplet 130 as one of the steps of the method for manufacturing the semiconductor package 100 according to the at least one embodiment.

Referring to FIG. 13, the third chiplet 130 is disposed on a portion of the redistribution layer structure 150 on the first chiplet 200 and a portion of the redistribution layer structure 150 on the second chiplet 200-1. The third chiplet 130 is electrically coupled to the redistribution layer structure 150 on the first chiplet 200 and the redistribution layer structure 150 on the second chiplet 200-1 by a connection member 135. The third chiplet 130 includes a BEOL structure (not shown). The third chiplet 130 connects the first chiplet 200, the second chiplet 200-1, a fourth chiplet 140, and a fifth chiplet 170, and transfers a signal between the first chiplet 200, the second chiplet 200-1, the fourth chiplet 140, and the fifth chiplet 170 through the BEOL structure. In at least one embodiment, the third chiplet 130 may include a silicon (Si) bridge layer.

Figure 14:
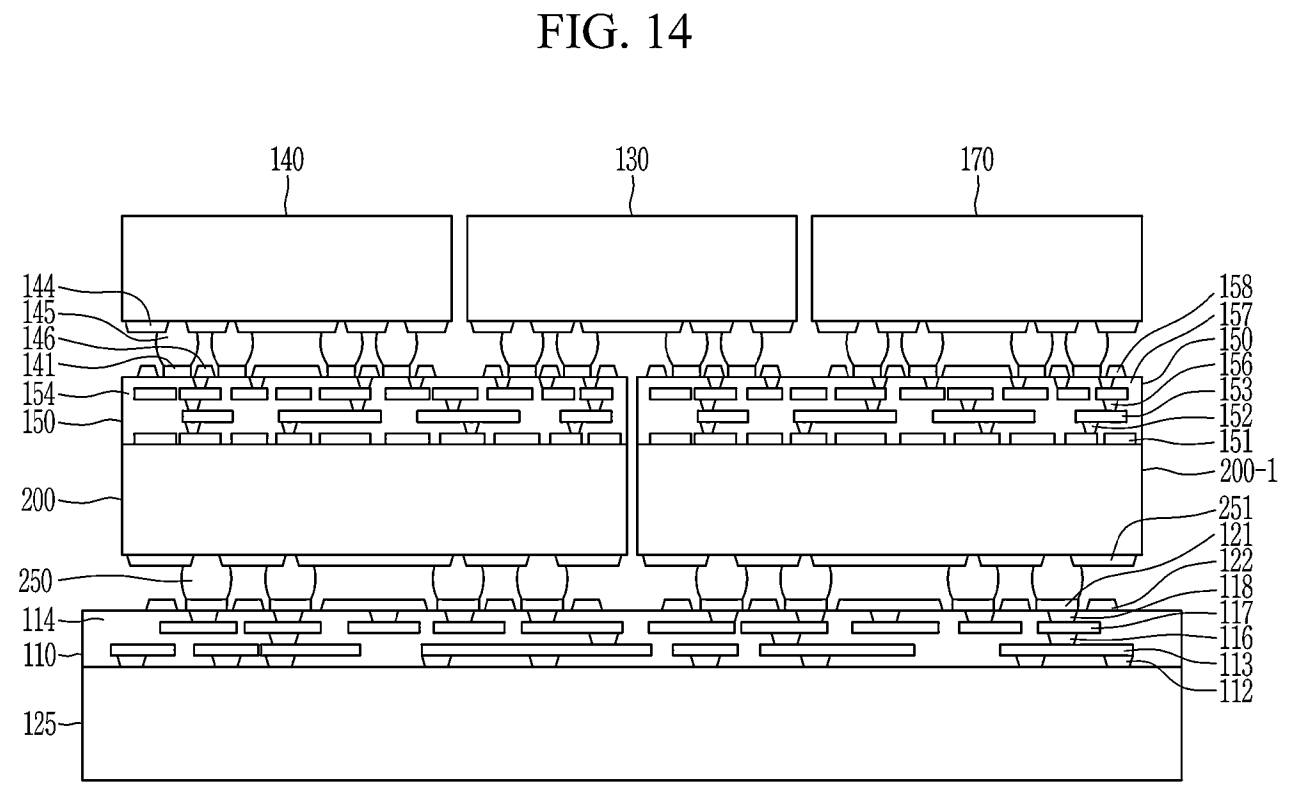

FIG. 14 is a cross-sectional view illustrating a step of mounting the fourth chiplet 140 and the fifth chiplet 170 on the first chiplet 200 and the second chiplet 200-1 as one of the steps of the method for manufacturing the semiconductor package according to the at least one embodiment.

Referring to FIG. 14, the fourth chiplet 140 or the fifth chiplet 170 may be mounted on the redistribution layer structure 150 of the first chiplet 200 or the redistribution layer structure 150 of the second chiplet 200-1. The fourth chiplet 140 and the fifth chiplet 170 may be disposed side by side with the third chiplet 130. In at least one embodiment, at least one of: the fourth chiplet 140 and the fifth chiplet 170 may be a dummy die or a dummy stack. In at least one embodiment, the dummy die or the dummy stack may include a conductor, such as at least one of: copper, aluminum, gold, silver, iron, stainless steel (SUS), an alloy thereof, and/or the like. At least one of the fourth chiplet 140 and/or the fifth chiplet 170 may be formed as the dummy die and/or the dummy stack to enhance a heat dissipation characteristic of the semiconductor package. For example, the at least one of the fourth chiplet 140 and/or the fifth chiplet 170 may be configured to draw heat from a corresponding one of the first or second chiplets 200 and 200-1, and/or to redistribute the heat from one section of the corresponding one of the first or second chiplets 200 and 200-1 to another section of the corresponding one of the first or second chiplets 200 and 200-1. In at least one embodiment, functional elements (such as active elements (e.g., transistors) and/or passive elements (e.g., capacitors)) may be omitted from the dummy die and/or dummy stack and/or the paths for heat dissipation may circumnavigate functional elements such that the paths for heat dissipation are electrically isolated from the functional elements but convey heat away from the active elements through, e.g., thermal conduction.

Figure 15:
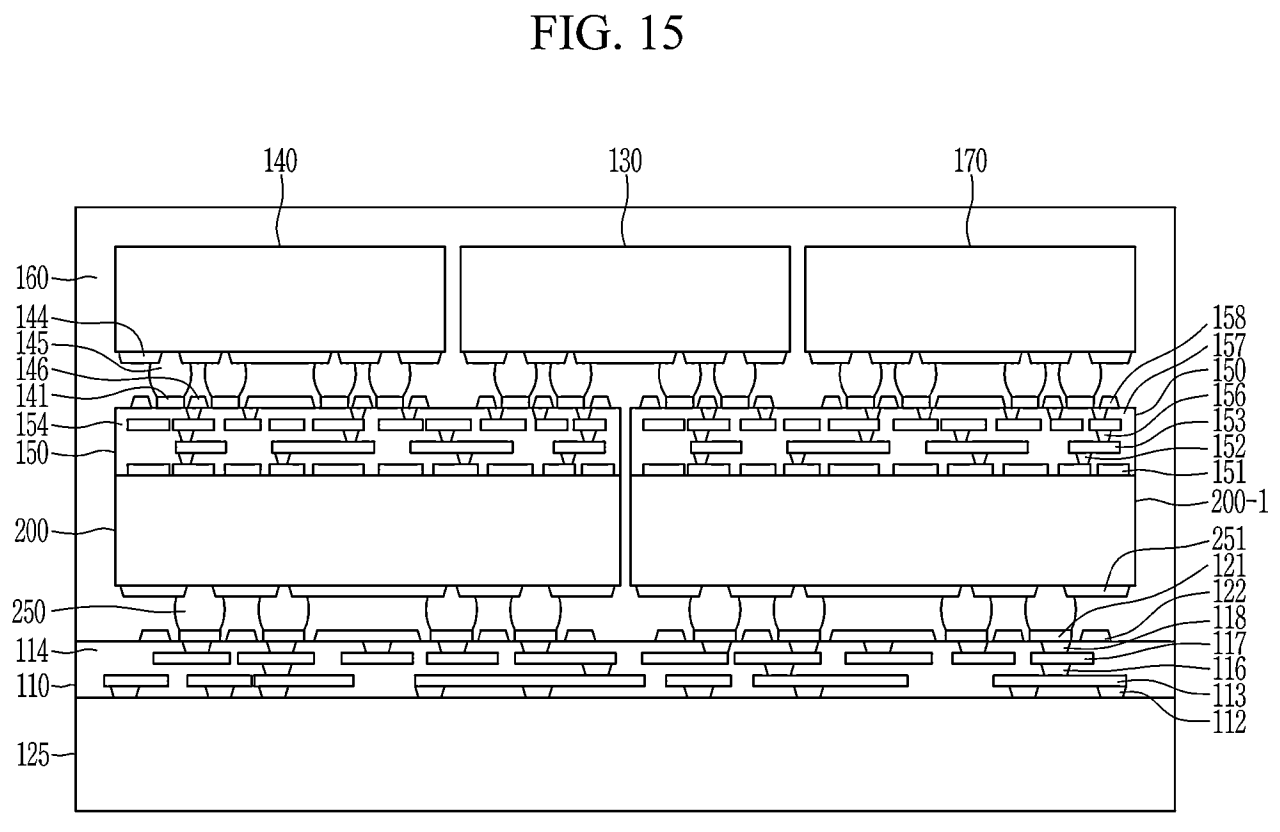

FIG. 15 is a cross-sectional view illustrating a step of molding the first chiplet 200, the second chiplet 200-1, the third chiplet 130, the fourth chiplet 140, and the fifth chiplet 170 on the redistribution layer substrate 110 as one of the steps of the method for manufacturing the semiconductor package 100 according to the at least one embodiment.

Referring to FIG. 15, the first chiplet 200, the second chiplet 200-1, the third chiplet 130, the fourth chiplet 140, and the fifth chiplet 170 are molded on the redistribution layer substrate 110 with an encapsulant 160. In at least one embodiment, the encapsulant 160 may comprise an epoxy, such as an epoxy molding compound (EMC). In at least one example, a process of molding with the encapsulant 160 may include a compression molding and/or transfer molding process. After the molding is performed with the encapsulant, a CMP process may be performed at an upper surface of the encapsulant to level the upper surface.

Figure 16:
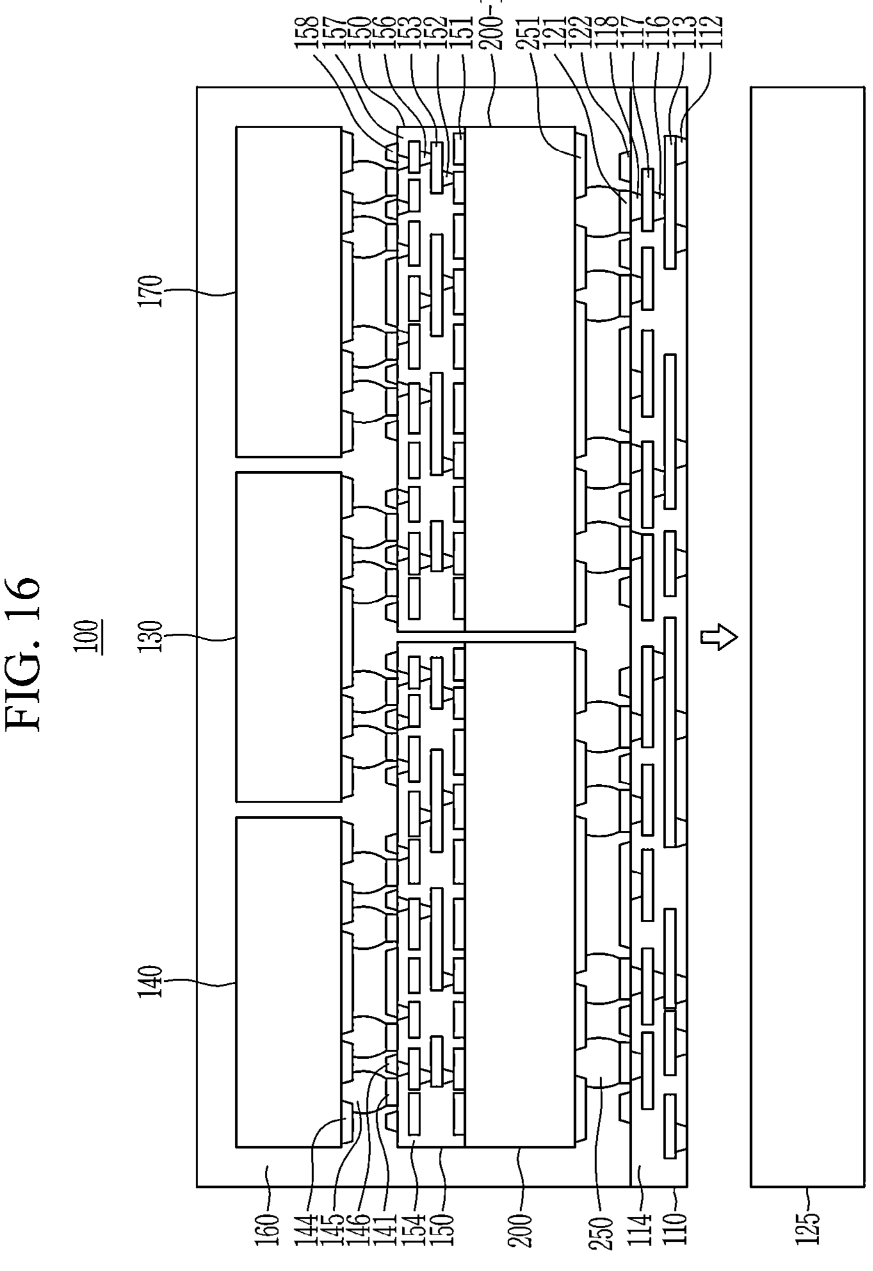
FIG. 16 is a cross-sectional view illustrating a step of de-bonding the carrier from the redistribution layer substrate as one of the steps of the method for manufacturing the semiconductor package according to the at least one embodiment.

FIG. 16 is a cross-sectional view illustrating a step of de-bonding the carrier 125 from the redistribution layer substrate 110 as one of the steps of the method for manufacturing the semiconductor package 100 according to the embodiment.

Referring to FIG. 16, the carrier 125 is de-bonded from the redistribution layer substrate 110.

Figure 17:
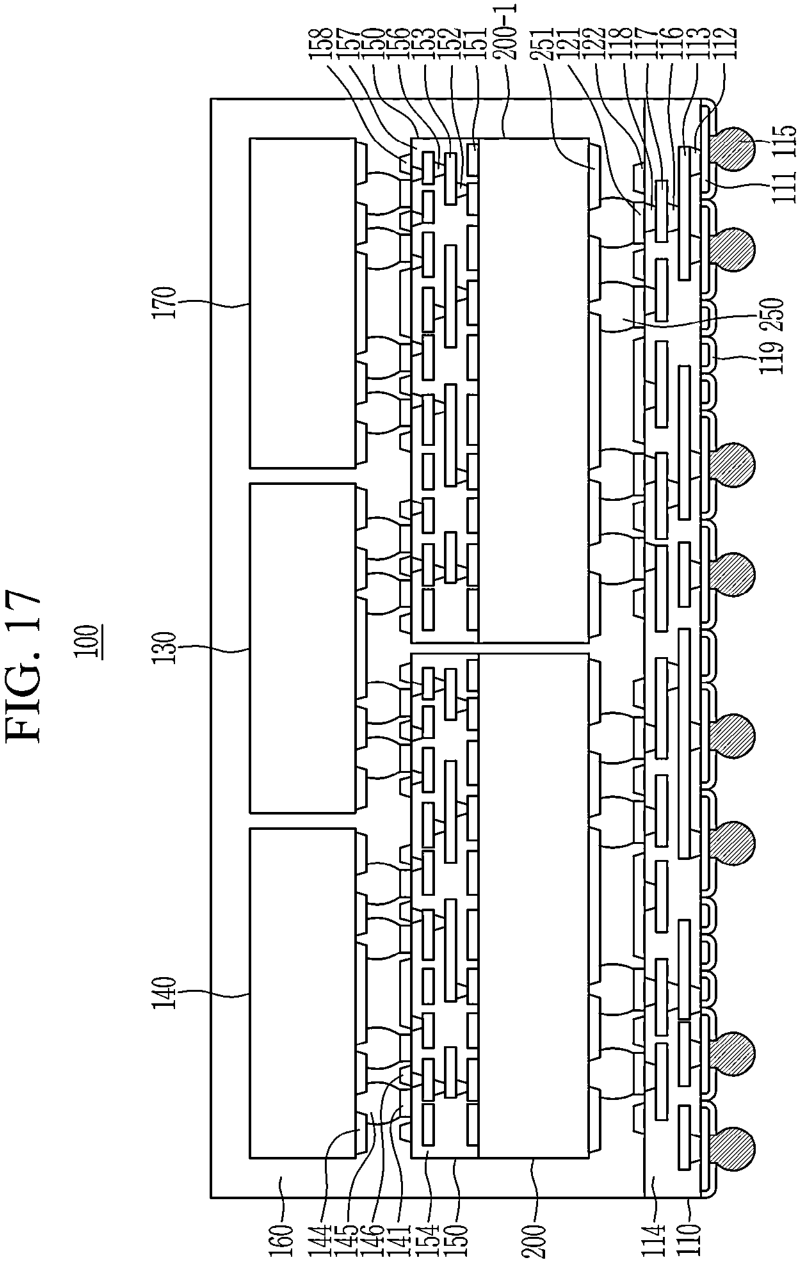
FIG. 17 is a cross-sectional view illustrating a step of forming an external connection terminal below the redistribution layer substrate as one of the steps of the method for manufacturing the semiconductor package according to the at least one embodiment.

FIG. 17 is a cross-sectional view illustrating a step of forming an external connection terminal 115 below the redistribution layer substrate 110 as one of the steps of the method for manufacturing the semiconductor package 100 according to the at least one embodiment.

Referring to FIG. 17, a bonding pad 111, an insulating layer 119, and the external connection terminal 115 are formed below a lower surface of the redistribution layer substrate 110. In at least one embodiment, the external connection terminal 115 may include a solder including, e.g., at least one of: tin, silver, lead, nickel, copper, an alloy thereof, and/or the like.

While this disclosure has been described in connection with what is presently considered to be practical embodiments, it is to be understood that the disclosure is not limited to the disclosed embodiments, and is intended to cover various modifications and equivalent arrangements included within the spirit and scope of the appended claims.

What is claimed is:

1. A semiconductor package comprising:

a first chiplet including a first substrate including a first active side and a first back side opposite to the first active side, the first back side of the first substrate including a first back side power distribution network (BSPDN);

a second chiplet including a second substrate including a second active side and a second back side opposite to the second active side, the second back side of the second substrate including a second BSPDN, wherein the first substrate and the second substrate are side by side with each other;

a third chiplet above the first chiplet and the second chiplet and electrically coupling the first chiplet and the second chiplet to each other; and a fourth chiplet and a fifth chiplet side by side with the third chiplet.

2. The semiconductor package of claim 1, wherein the first chiplet further comprises a first through silicon via (TSV) in the first back side of the first substrate; and the second chiplet further comprises a second through silicon via (TSV) in the second back side of the second substrate.

3. The semiconductor package of claim 2, wherein the first active side of the first chiplet comprises a first back end of the line (BEOL) structure, and a first front end of the line (FEOL) structure under the first BEOL structure and wherein the second active side of the second chiplet comprises a second back end of the line (BEOL) structure, and a second front end of the line (FEOL) structure under the second BEOL structure.

4. The semiconductor package of claim 3, wherein the first FEOL structure includes a first buried power rail (BPR), and the second FEOL structure includes a second buried power rail (BPR).

5. The semiconductor package of claim 4, wherein, in the first chiplet, one end of the first TSV is bonded to the first BPR, and another end of the first TSV is bonded to the first BSPDN, and in the second chiplet, one end of the second TSV is bonded to the second BPR, and another end of the second TSV is bonded to the second BSPDN.

6. The semiconductor package of claim 3, wherein the first FEOL structure includes at least one first transistor, and the second FEOL structure includes at least one second transistor.

7. The semiconductor package of claim 6, wherein, in the first chiplet, one end of the first TSV is bonded to the first transistor, and another end of the first TSV is bonded to the first BSPDN, and wherein, in the second chiplet, one end of the second TSV is bonded to the second transistor, and another end of the second TSV is bonded to the second BSPDN.

8. The semiconductor package of claim 3, wherein each of the first BEOL structure and the second BEOL structure includes a plurality of signal wiring layers.

9. The semiconductor package of claim 1, wherein at least one of the fourth chiplet and the fifth chiplet is a dummy die.

10. The semiconductor package of claim 9, wherein the dummy die includes at least one of copper, aluminum, gold, silver, iron, or stainless steel.

11. The semiconductor package of claim 1, wherein the third chiplet includes a silicon (Si) bridge layer.

12. A semiconductor package comprising:

a redistribution layer substrate;

a first chiplet and a second chiplet above the redistribution layer substrate and side by side with each other, wherein each of the first chiplet and the second chiplet includes a back side power distribution network (BSPDN);

a first redistribution layer structure on the first chiplet;

a second redistribution layer structure on the second chiplet;

a third chiplet above the first chiplet and the second chiplet, and overlapping with a partial region of the first redistribution layer structure and a partial region of the second redistribution layer structure, the third chiplet configured to electrically couple the first redistribution layer structure and the second redistribution layer structure; and a fourth chiplet and a fifth chiplet side by side with the third chiplet.

13. The semiconductor package of claim 12, further comprising:

an encapsulant molding the first chiplet, the second chiplet, the third chiplet, the fourth chiplet, and the fifth chiplet on the redistribution layer substrate.

14. The semiconductor package of claim 13, wherein the encapsulant includes an epoxy molding compound (EMC).

15. A method for manufacturing a semiconductor package, comprising:

forming a first chiplet and a second chiplet, wherein the first chiplet and the second chiplet include a back side power distribution network (BSPDN);

forming a first redistribution layer structure on the first chiplet;

forming a second redistribution layer structure on the second chiplet;

mounting the first chiplet and the second chiplet on a redistribution layer substrate;

mounting a third chiplet above the first redistribution layer structure and the second redistribution layer structure such that the third chiplet overlaps on a partial region of the first redistribution layer structure and a partial region of the second redistribution layer structure and electrically couples the first redistribution layer structure and the second redistribution layer structure;

mounting a fourth chiplet on the first redistribution layer structure and a fifth chiplet on the second redistribution layer structure such that the fourth chiplet and the fifth chiplet are side by side with the third chiplet; and molding the first redistribution layer structure, the second redistribution layer structure, the first chiplet, the second chiplet, the third chiplet, the fourth chiplet, and the fifth chiplet on the redistribution layer substrate.

16. The method of claim 15, wherein the forming the first chiplet and the second chiplet each comprise:

forming a front end of the line (FEOL) structure on an active side of a first wafer, forming a first back end of the line (BEOL) structure on the FEOL structure, bonding a second wafer to the first BEOL structure, forming a through silicon via (TSV) at a back side of the first wafer, forming a second BEOL structure at the back side of the first wafer, and de-bonding the second wafer, and wherein the forming the first redistribution layer structure and the forming the second redistribution layer structure includes forming the first redistribution layer structure and the second redistribution layer structure on the first BEOL structure of first chiplet and the second chiplet, respectively.

17. The method of claim 16, wherein the bonding the second wafer to the first BEOL structure comprises bonding an oxide layer of the second wafer to the first BEOL structure.

18. The method of claim 16, wherein the forming the FEOL structure on the active side of the first wafer comprises forming a transistor and a buried power rail (BPR).

19. The method of claim 16, wherein the forming the first BEOL structure on the FEOL structure comprises forming a plurality of signal wiring layers.

20. The method of claim 16, wherein the forming the TSV at the back side of the first wafer and forming the second BEOL structure at the back side of the first wafer comprises forming the back side power distribution network (BSPDN).

* * * * *